United States Patent
Tanaka et al.

(10) Patent No.: US 8,455,912 B2
(45) Date of Patent: Jun. 4, 2013

(54) SEMICONDUCTOR LIGHT EMITTING DEVICE AND MANUFACTURING METHOD THEREOF

(75) Inventors: Satoshi Tanaka, Tokyo (JP); Yusuke Yokobayashi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 117 days.

(21) Appl. No.: 12/878,197

(22) Filed: Sep. 9, 2010

(65) Prior Publication Data

US 2011/0062484 A1 Mar. 17, 2011

(30) Foreign Application Priority Data

Sep. 14, 2009 (JP) ................................ 2009-211537

(51) Int. Cl.
*H01L 33/36* (2010.01)
*H01L 33/00* (2010.01)

(52) U.S. Cl.
USPC ............... 257/99; 257/79; 257/98; 257/100; 257/E33.001; 257/E33.066; 438/22; 438/39; 438/82

(58) Field of Classification Search
USPC ............... 257/99, 98, 79, E33.001, E33.066, 257/88, 100, 103, 613, 615; 438/22, 39, 82
See application file for complete search history.

(56) References Cited

U.S. PATENT DOCUMENTS

2011/0233596 A1* 9/2011 Sano et al. ...................... 257/98
2011/0253977 A1* 10/2011 Oya et al. ....................... 257/13

FOREIGN PATENT DOCUMENTS

JP 2001-345480 A 12/2001

* cited by examiner

*Primary Examiner* — Cathy N Lam (74) *Attorney, Agent, or Firm* — Holtz, Holtz, Goodman & Chick, P.C.

(57) ABSTRACT

A light-emitting device which includes a first semiconductor layer of a first conductivity type; a second semiconductor layer of a second conductivity type; and a light emitting layer provided between the first and second semiconductor layers, the device comprises a first electrode formed on the first semiconductor layer; a second electrode formed on the second semiconductor layer; and a light-transmissive electrode covering the second semiconductor layer and the second electrode, wherein contact between the second electrode and the second semiconductor layer is non-ohmic, and the second electrode has a stacked structure including a lower layer and an upper layer whose contact resistance with the light-transmissive electrode is lower than that of the lower layer, part of the second electrode being exposed through an opening formed in the light-transmissive electrode.

5 Claims, 11 Drawing Sheets

SEMICONDUCTOR LIGHT EMITTING DEVICE AND MANUFACTURING METHOD THEREOF

BACKGROUND OF THE INVENTION

1. Technical Field

The present invention relates to a semiconductor light emitting device and particularly to the electrode structure of a light emitting diode (hereinafter referred to as an LED).

2. Description of the Related Art

Figure 1A:
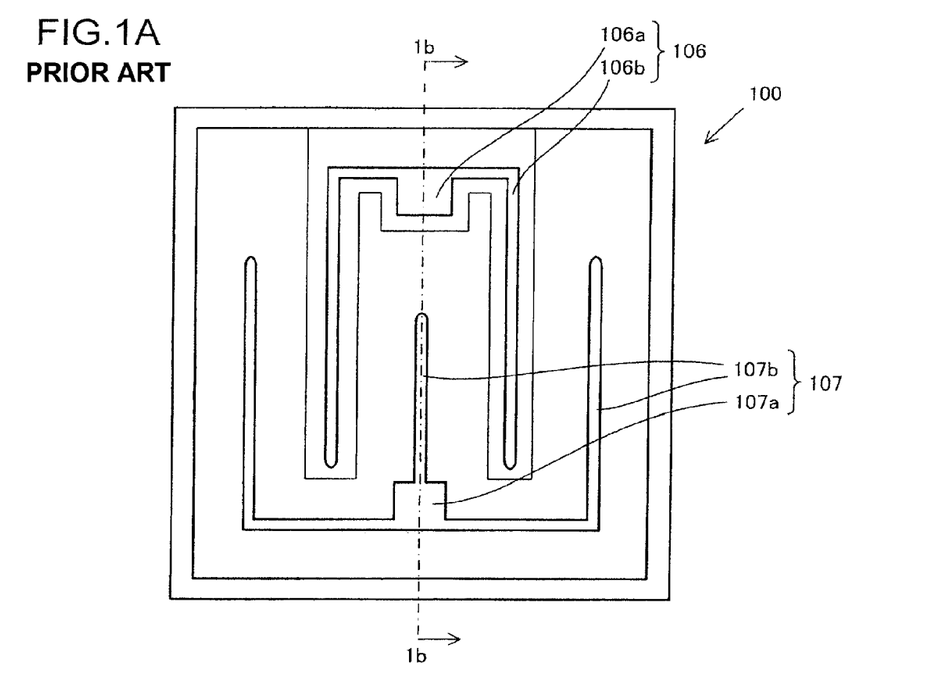
FIG. 1A is a plan view showing a conventional LED chip structure.
Figure 1B:
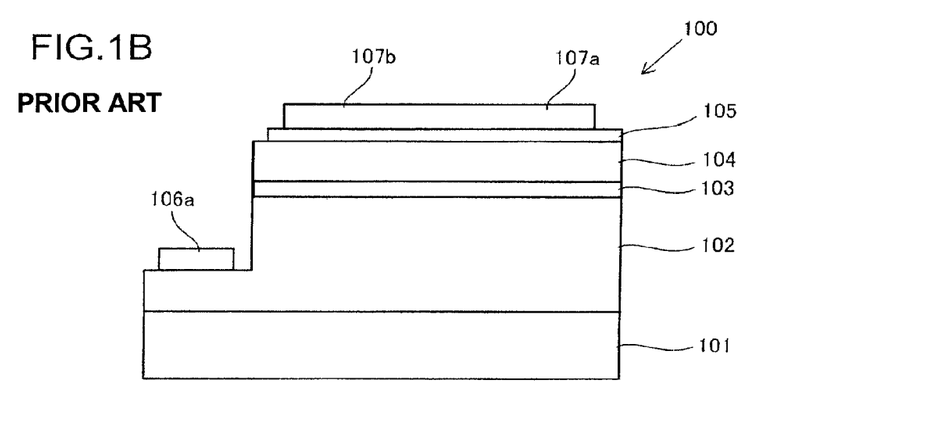
FIG. 1B is a cross-sectional view taken along line 1b-1b of FIG. 1A.

FIGS. 1A and 1B show the structure of a conventional LED chip 100. Refer to, for example, Japanese Patent Application Laid-Open Publication No. 2001-345480. The LED chip 100 has a sapphire substrate 101, an n-layer 102, a light emitting layer 103, a p-layer 104, a transparent electrode 105, an n-electrode 106 formed on the n-layer 102, and a p-electrode 107 formed on the transparent electrode 105. Because the p-layer 104 is lower in conductivity and thinner in film thickness than the n-layer 102, current is difficult to be diffused in planar directions of the LED chip in the p-layer. Hence, the transparent electrode 105, which makes the current diffuse in planar directions and allows light from the light emitting layer 103 to pass therethrough, is provided on the surface of the p-layer 104. By providing the transparent electrode 105 between the p-layer 104 and the p-electrode 107, a light emission driving current is made to be diffused in planar directions of the LED chip 100, and thus the in-plane uniformity of light emission brightness distribution can be improved. However, only with the transparent electrode being provided, that effect is not enough, and current concentration and light emission concentration will occur in the peripheries of the p-electrode and the n-electrode and in the vicinity of a straight line joining these electrodes. Accordingly, the n-electrode 106 and the p-electrode 107 each have an auxiliary electrode. Specifically, the n-electrode 106 comprises an n-pad portion 106a and comb tooth-shaped n-auxiliary electrodes 106b connected thereto, and the p-electrode 107 includes a p-pad portion 107a and comb tooth-shaped p-auxiliary electrodes 107b connected thereto. By making the distance between the n-auxiliary electrodes 106b and the p-auxiliary electrodes 107b constant, the density of the light emission driving current flowing between these electrodes becomes uniform, and thus the light emission brightness distribution can be made uniform across the LED chip surface.

SUMMARY OF THE INVENTION

In the conventional LED chip structure described above, a certain degree of light absorption cannot be avoided, since the n-electrode 106 and the p-electrode 107 are made mainly of metal-based material. Hence, from the viewpoint of light extraction efficiency, the areas of both the electrodes are preferably as small as possible, and the auxiliary electrodes are preferably formed to be narrow in width. However, where the auxiliary electrodes are shaped like a thin line, heat generation due to the current when the LED is driven increases in amount, resulting in the occurrence of a failure where the p-auxiliary electrode 107b peels off due to stress based on the difference in thermal expansion coefficient between the p-auxiliary electrode 107b and the transparent electrode 105.

Further, although titanium (Ti) is generally used as material for the p-electrode 107 so as to secure adhesion between the transparent electrode 105 made of oxide such as indium tin oxide (ITO) and the p-electrode 107, titanium (Ti) has the properties of being low in optical reflectivity and likely to absorb light. In order to secure adhesion between the thin line-shaped p-auxiliary electrode 107b and the transparent electrode 105, the film thickness of titanium (Ti) needs to be 250 Å (angstroms) or greater, but in this case, the optical reflectivity of the Ti layer surface is greatly reduced to about 50% or less. As such, with the conventional LED structure having the p-electrode formed on the transparent electrode, electrode material for the p-electrode is selected giving priority to securing adhesion to the transparent electrode, and hence it is difficult to avoid light absorption by the p-electrode.

The present invention was made in view of the above facts, and an object thereof is to provide a semiconductor light emitting device that can solve the problem of the auxiliary electrode peeling off and improve light extraction efficiency.

According to the present invention, there is provided a semiconductor light emitting device which includes a first semiconductor layer of a first conductivity type (or conduction type); a second semiconductor layer of a second conductivity type different from the first conductivity type; and a light emitting layer provided between the first semiconductor layer and the second semiconductor layer, the semiconductor light emitting device comprises a first electrode formed on the first semiconductor layer; a second electrode formed on the second semiconductor layer; and a light-transmissive electrode covering the second semiconductor layer and the second electrode, wherein contact between the second electrode and the second semiconductor layer is non-ohmic, and the second electrode has a stacked structure including a lower layer and an upper layer whose contact resistance with the light-transmissive electrode is lower than that of the lower layer, part of the second electrode being exposed through an opening formed in the light-transmissive electrode.

Further, according to the present invention, there is provided a manufacturing method of a semiconductor light emitting device the method includes the steps of forming a first semiconductor layer of a first conductivity type on a substrate; forming a light emitting layer on the first semiconductor layer; forming a second semiconductor layer of a second conductivity type different from the first conductivity type on the light emitting layer; making the first semiconductor layer partially exposed; forming a first electrode on the first semiconductor layer; forming a second electrode on the second semiconductor layer such that contact of the second electrode with the second semiconductor layer is non-ohmic; forming a light-transmissive electrode so as to cover the second semiconductor layer and the second electrode; and forming an opening in the light-transmissive electrode so that part of the second electrode is exposed through the opening, wherein the second electrode forming step includes a step of forming on the second semiconductor layer a lower layer made of one material of aluminum, rhodium, and silver, or an alloy of the materials and an upper layer whose contact resistance with the light-transmissive electrode is lower than that of the lower layer.

The semiconductor light emitting device according to the present invention has a configuration where the p-electrode (or n-electrode) is formed directly on the semiconductor film and where the p-electrode (or n-electrode) is covered by a transparent or light-transmissive electrode, and hence the p-electrode (or n-electrode) can be prevented from peeling off. Therefore, electrode material can be selected while taking the optical reflectivity thereof into consideration, thus improving the light extraction efficiency. Further, because the contact between the p-electrode (or n-electrode) and the semiconductor film is non-ohmic contact (Schottky contact), current concentration directly under the p-electrode (or n-electrode) can be prevented, thereby causing the light emission brightness distribution to be uniform.

DETAILED DESCRIPTION OF THE INVENTION

Embodiments of the present invention will be described below with reference to the attached drawings. In the figures cited below, the same reference numerals are used to denote substantially the same or equivalent constituents or portions.

First Embodiment

Figure 2A:
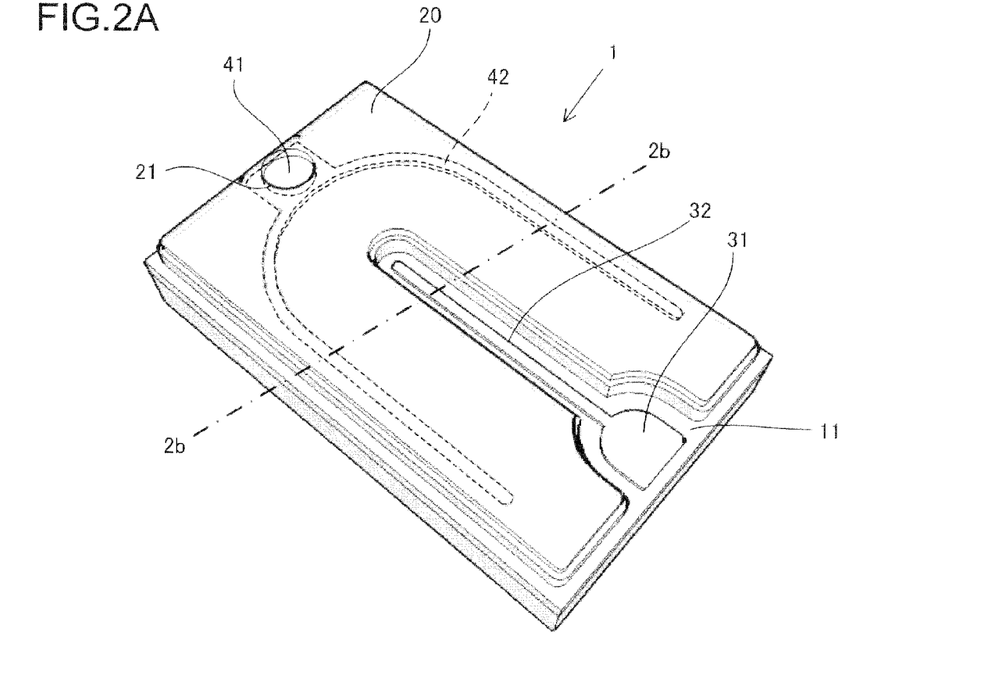
FIG. 2A is a perspective view of an LED chip according to a first embodiment of the present invention.
Figure 2B:
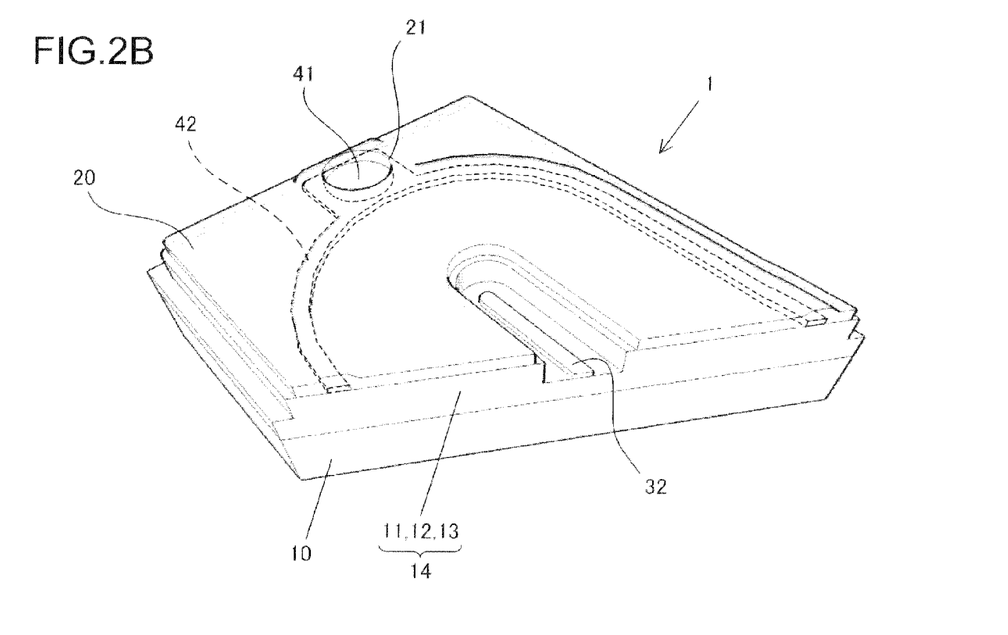
FIG. 2B is a perspective view including a cross-section taken along line 2b-2b of FIG. 2A.
Figure 3:
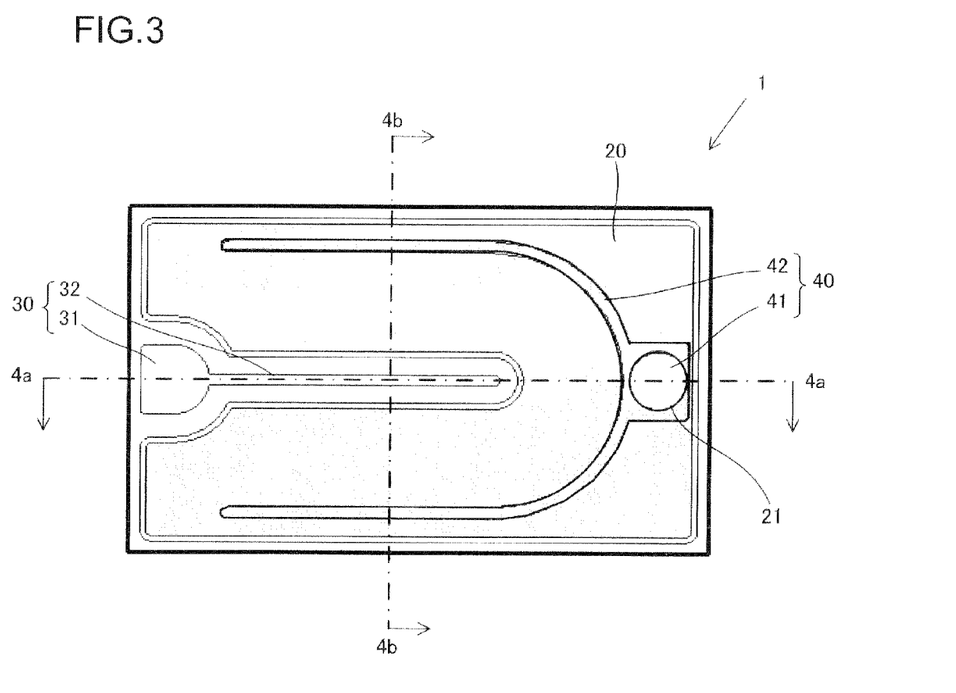
FIG. 3 is a plan view of the LED chip according to the first embodiment of the present invention.
Figure 4A:
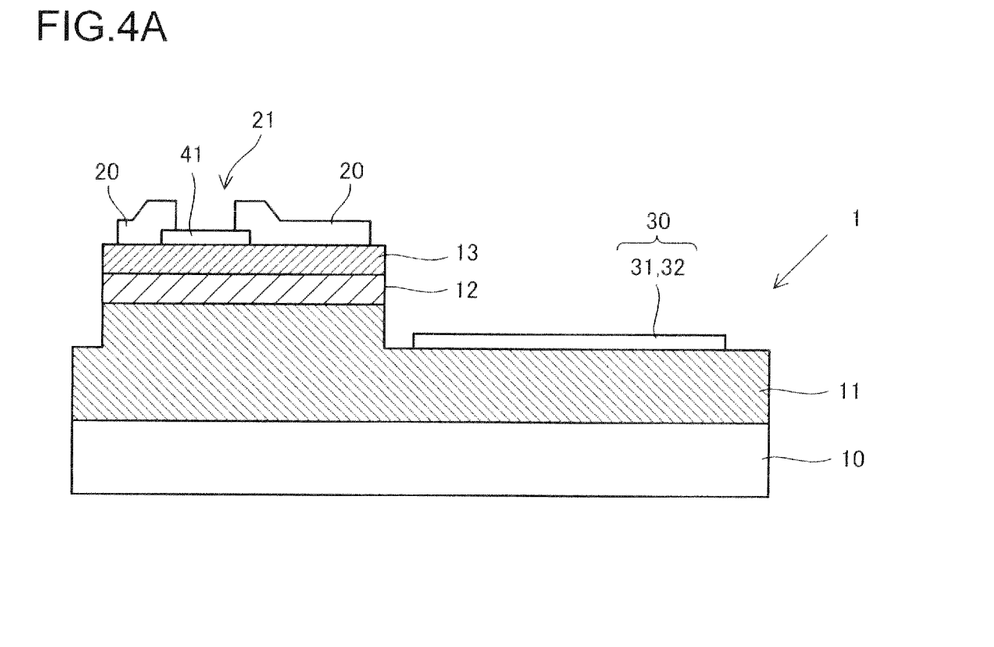
FIG. 4A is a cross-sectional view taken along line 4a-4-a of FIG. 3.
Figure 4B:
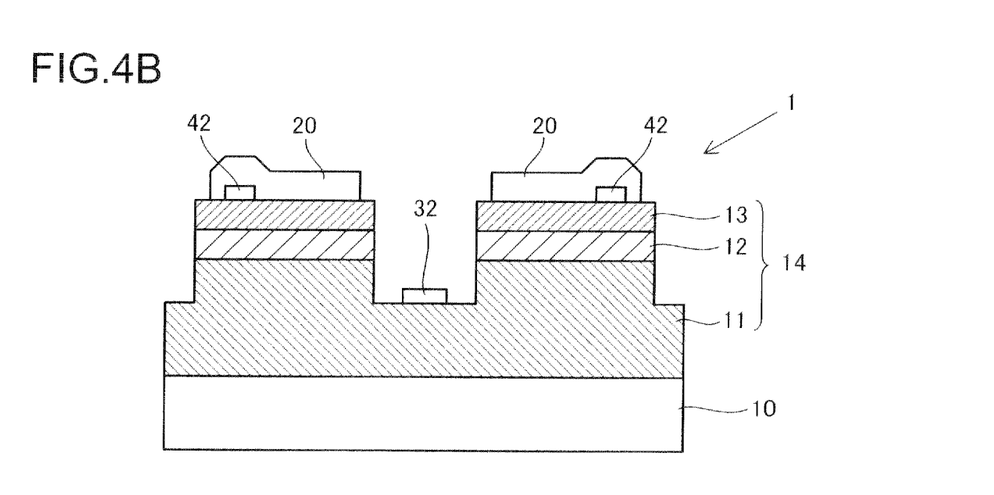
FIG. 4B is a cross-sectional view taken along line 4b-4-b of FIG. 3.

FIG. 2A is a perspective view showing the structure of an LED chip 1 that is an embodiment of the present invention; FIG. 2B is a perspective view including a cross-section taken along line 2b-2b of FIG. 2A; FIG. 3A is a plan view; and FIGS. 4A and 4B are respectively cross-sectional views taken along lines 4a-4a and 4b-4-b of FIG. 3.

A semiconductor film 14 is formed on a growth substrate (i.e., a substrate used for crystal growth) 10 constituted by a C-plane sapphire substrate or the like, which film is configured with an n-layer 11, a light emitting layer 12, and a p-layer 13, which are made of, e.g., $Al_xIn_yGa_zN$ ($0 \leq x \leq 1$, $0 \leq y \leq 1$, $0 \leq z \leq 1$, $x+y+z=1$) and laid one over another in this order. An n-electrode 30 is formed on the surface of the n-layer 11 exposed by etching down part of the semiconductor film 14. As shown in FIG. 3, the n-electrode has an n-pad portion (hereinafter, simply referred to as n-pad) 31 to be wire-bonded and an n-auxiliary electrode 32 connected to the n-pad 31 and extending along the center line of the LED chip 1. The n-auxiliary electrode 32 has the role of diminishing or reducing current concentration when the LED is driven, thereby making the light emission brightness distribution uniform.

A p-electrode 40 is provided on the surface of the p-layer 13. Specifically, the p-electrode 40 is directly connected to the surface of the p-layer, not onto a transparent or light-transmissive electrode. The p-electrode 40 has a p-pad portion (hereinafter, simply referred to as p-pad) 41 to be wire-bonded and a substantially U-shaped p-auxiliary electrode 42 connected to the p-pad 41 and formed surrounding the n-auxiliary electrode 32 substantially. The p-auxiliary electrode 42, together with the n-auxiliary electrode 32, has the role of relaxing current concentration when the LED is driven, thereby making the light emission brightness distribution uniform. The n-auxiliary electrode 32 and the p-auxiliary electrode 42 are placed such that the distance between both the electrodes is constant across the surface of the LED chip 1. By this configuration, the distribution of the light emission driving current flowing between both the electrodes becomes uniform across the surface of the LED chip 1, and thus the light emission brightness distribution can be made uniform.

The surfaces of the p-electrode 40 and the p-layer 13 are covered by a transparent or light-transmissive electrode 20 made of, e.g., indium tin oxide (ITO). The light-transmissive electrode 20 is provided with an opening 21. The p-pad 41 is partially exposed through the opening 21, and can be wire-bonded.

As such, the p-pad 41 and the thin line-shaped p-auxiliary electrode 42 are formed directly on the semiconductor film 14 that is more likely to secure adhesion to them as compared with ITO, and are covered by the light-transmissive electrode 20 except the opening 21. Hence, they are unlikely to peel off even with thermal stress applied thereto.

Figure 5:
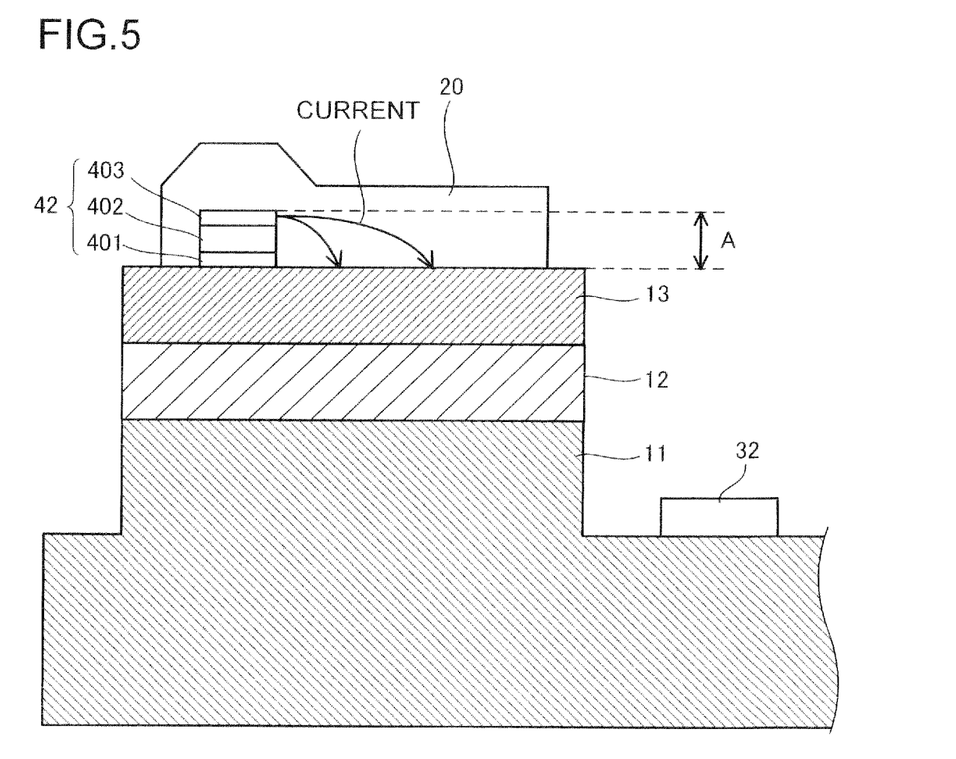
FIG. 5 is an enlarged cross-sectional view of an electrode portion of the LED chip according to the first embodiment of the present invention.

FIG. 5 is an enlarged cross-sectional view of the portion where the p-auxiliary electrode 42 is formed. As shown in the figure, the p-electrode 40 can be of multilayer structure. A lower layer 401 of the p-auxiliary electrode 42 and the p-pad 41 contacting with the semiconductor film 14 is preferably made of any of aluminum (Al), rhodium (Rh), and silver (Ag), which are relatively high in optical reflectivity, or an alloy including these materials. An increase in the optical reflectivity of the lower layer 401 in contact with the semiconductor film 14 causes the amount of light absorbed by the p-electrode 40 to decrease, thus improving the light extraction efficiency. As described above, the p-electrode 40 is covered by the light-transmissive electrode 20, and its adhesion to the semiconductor film 14 is secured. Hence, material selection can be made giving priority to the optical reflectivity.

The contact between the lower layer 401 and the semiconductor film 14 is preferably non-ohmic contact (or Schottky contact). By making the contact between the semiconductor film 14 and the p-electrode 40 be non-ohmic contact and making the contact resistance between the p-electrode 40 and the p-layer 13 higher than the contact resistances between the p-electrode 40 and the light-transmissive electrode 20 and between the light-transmissive electrode 20 and the p-layer 13, current concentration directly under the p-electrode 40 can be prevented, and thus current can be diffused in the light-transmissive electrode 20. With this configuration, even with the structure where the p-electrode 40 is provided directly on the semiconductor film 14, the light emission brightness distribution can be made uniform. For example, for the GaN-based semiconductor film 14, the contact with the semiconductor film 14 becomes non-ohmic contact (i.e., Schottky contact) when selecting aluminum (Al) for the lower layer 401.

Among other methods for obtaining non-ohmic contact, there is a method which performs plasma processing on part of the surface of the p-layer 13 on which the p-electrode is to be formed so as to be of high resistance. According to this method, even if rhodium (Rh), silver (Ag), or the like other than aluminum (Al) is used for the lower layer 401, the layer can form non-ohmic contact with the p-layer 13.

In order to strengthen the adhesion between the p-electrode 40 and the p-layer 13, the lower layer 401 may contain a very small amount of titanium (Ti) or nickel (Ni). Note that if the lower layer 401 contains titanium (Ti) or nickel (Ni), the thickness of the Ti or Ni layer is preferably 10 Å (angstroms) or less so as to suppress a decrease in the optical reflectivity as much as possible.

A middle layer 402 of titanium (Ti), nickel (Ni), or the like may be provided on the lower layer 401. By using titanium (Ti) or nickel (Ni) for the middle layer 402, the adhesion between the light-transmissive electrode 20 and the p-electrode 40 is improved. Further, the total film thickness of the p-electrode 40 increases by providing the middle layer 402, and thus the sheet resistance of the thin line-shaped p-auxiliary electrode 42 decreases, resulting in current being likely to spread to the end portions of the p-auxiliary electrode 42.

An upper layer 403 made of a material whose contact resistance with the light-transmissive electrode 20 is lower than those of the lower layer 401 and the middle layer 402, is provided on the middle layer 402. For example, gold (Au) is preferably used as the material of the upper layer 403. As such, by making the contact resistance with the light-transmissive electrode 20 of the upper layer 403 of the layers forming the p-electrode 40 be minimal, current can be caused to flow mainly from the upper layer 403 to the light-transmissive electrode 20 as shown in FIG. 5, thus enhancing current diffusion into the light-transmissive electrode 20. If the p-electrode 40 were a single layer of a single material, current flowing out of the p-electrode would immediately flow into the p-layer 13 without being spread widely in the light-transmissive electrode 20, and as a result, the current would be concentrated in the vicinity of the p-electrode 40, making it difficult to achieve a uniform light emission brightness distribution.

As the film thickness of the p-electrode 40 becomes greater, the current path (width "A" in FIG. 5) in a thickness direction of the light-transmissive electrode 20 becomes wider. In other words, as the film thickness of the p-electrode 40 becomes greater, the effective sheet resistance of the light-transmissive electrode becomes lower, which can enhance current diffusion in the light-transmissive electrode 20. Meanwhile, if the total film thickness of the p-electrode 40 is too large, thermal stress due to heat generation when the LED is driven will be large, so that peeling off may occur. Hence, the film thickness of the p-electrode is preferably set at 3,000 Å(angstroms) or less. The film thickness of the p-electrode 40 can be set at any value by adjusting mainly the film thicknesses of the middle layer 402 and the upper layer 403.

Making the p-electrode 40 have a stacked or layered structure formed of materials as described above, improves the light extraction efficiency of the LED chip 1, and in addition enhances current diffusion in the light-transmissive electrode 20, and thus a uniform light emission brightness distribution can be obtained.

Next, a manufacturing method of the LED chip 1 having the above structure will be described. FIGS. 6A to 6D are cross-sectional views for respective process steps showing the manufacturing method of the LED chip 1.

[Semiconductor Film Forming Step]

Figure 6A:
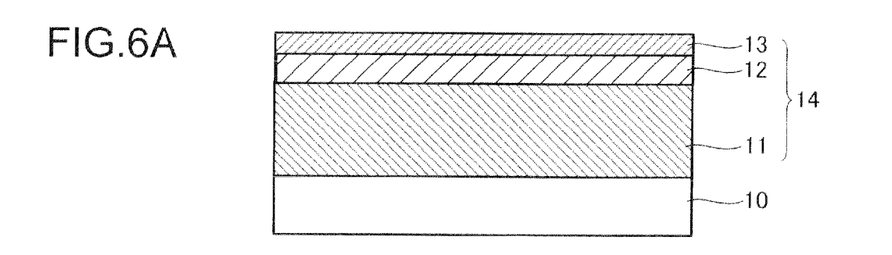
FIGS. 6A to 6D are cross-sectional views showing a manufacturing method of the LED chip according to the first embodiment of the present invention.

First, as the growth substrate 10, a C-plane sapphire substrate is prepared on which $Al_xIn_yGa_zN$ ($0 \leq x \leq 1$, $0 \leq y \leq 1$, $0 \leq z \leq 1$, $x+y+z=1$) can be grown. Then, the n-layer 11, the light emitting layer 12, and the p-layer 13, which are made of $Al_xIn_yGa_zN$, are sequentially grown on the growth substrate 10 by a metal organic chemical vapor deposition (MOCVD) method to form the semiconductor film 14 (FIG. 6A). Specifically, the sapphire substrate 10 is put into a MOCVD apparatus and heated in a hydrogen atmosphere at about 1,000° C. for about 10 minutes (for thermal cleaning). Then, the atmosphere or ambient temperature is adjusted to about 500° C., and trimethylgallium (TMG) at a flow rate of 10.4 μmol/min and ammonia ($NH_3$) at a flow rate of 3.3 LM are supplied for 3 minutes, thereby forming a low-temperature buffer layer of GaN (not shown). Subsequently, the ambient temperature is raised to 1,000° C., and this state is maintained for 30 seconds to crystallize the low-temperature buffer layer. Then, with the ambient temperature maintained, trimethylgallium (TMG) at a flow rate of 45 μmol/min and ammonia ($NH_3$) at a flow rate of 4.4 LM are supplied for 20 minutes, thereby forming an underlying GaN layer (not shown) of about 1 μm thickness. Then, at the ambient temperature of 1,000° C., trimethylgallium (TMG) at a flow rate of 45 μmol/min, ammonia ($NH_3$) at a flow rate of 4.4 LM, and silane ($SiH_4$) at a flow rate of $2.7 \times 10^{-9}$ μmol/min are supplied for 60 minutes, thereby growing an n-layer 11 of GaN of about 4 μm thickness.

A multi-quantum well structure of InGaN/GaN is applied to the light emitting layer 12. In the present embodiment, with an InGaN well layer and a GaN barrier layer as a period, growth of five periods of quantum wells is performed. At the ambient temperature of about 700° C., trimethylgallium (TMG) at a flow rate of 3.6 μmol/min, trimethylindium (TMI) at a flow rate of 10 μmol/min, and ammonia ($NH_3$) at a flow rate of 4.4 LM are supplied for 33 seconds, thereby forming an InGaN well layer of about 2.2 nm (nanometers) thickness. Subsequently, trimethylgallium (TMG) at a flow rate of 3.6 μmol/min and ammonia ($NH_3$) at a flow rate of 4.4 LM are supplied for 320 seconds, thereby forming a GaN barrier layer of about 15 nm thickness. By repeating this process five periods, the light emitting layer 12 is formed.

Then, the ambient temperature is raised to 870° C., and trimethylgallium (TMG) at a flow rate of 8.1 μmol/min, trimethylaluminum (TMA) at a flow rate of 7.5 μmol/min, ammonia ($NH_3$) at a flow rate of 4.4 LM, and CP2Mg (biscyclopentadienyl Mg) at a flow rate of $2.9 \times 10^{-7}$ μmol/min are supplied for 5 minutes, thereby growing a p-AlGaN clad layer (not shown) of about 40 nm thickness. Subsequently, with the ambient temperature maintained, trimethylgallium (TMG) at a flow rate of 18 μmol/min, ammonia ($NH_3$) at a flow rate of 4.4 LM, and CP2Mg at a flow rate of $2.9 \times 10^{-7}$ μmol/min are supplied for 7 minutes, thereby growing a p-layer 13 of GaN of about 150 nm thickness.

[Recess Forming Step]

Figure 6B:
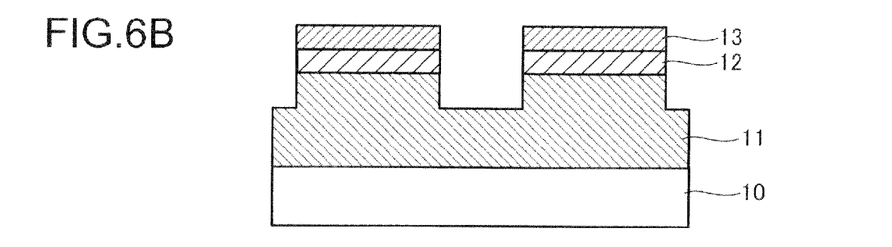

Next, part of the n-layer 11 is exposed by etching down part of the semiconductor film 14 where an n-electrode 30 is to be formed (FIG. 6B). Specifically, a photoresist is coated over the surface of the p-layer 13, and patterning of the photo resist is performed by photolithography to form a resist mask. Then, the substrate is put into a reactive ion etching (RIE) apparatus, and part of the semiconductor film 14 exposed through the resist mask is etched to make the n-layer 11 partially exposed.

[Electrode Forming Step]

Figure 6C:
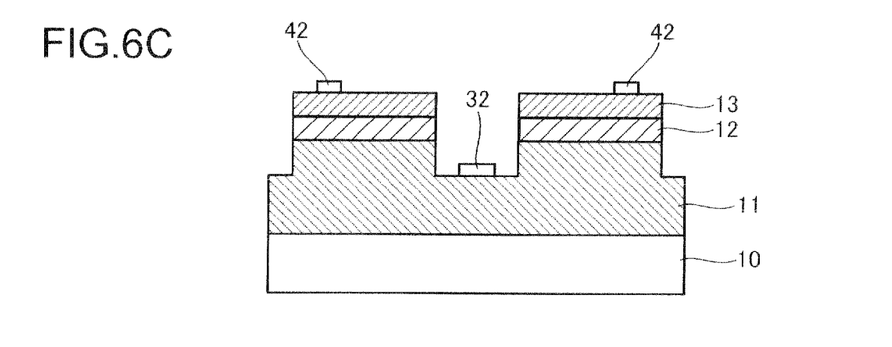

The n-electrode 30 and the p-electrode 40 are formed respectively on the surface of the p-layer 13 and the surface part exposed in the preceding etching step of the n-layer 11 by a lift-off method (FIG. 6C). Specifically, resist masks having desired patterns are formed on the surfaces of the n-layer 11 and the p-layer 13. Then, for the n-electrode 30, a titanium (Ti) film of about 10 Å thickness and an aluminum (Al) film of about 10,000 Å thickness are sequentially formed by electron beam evaporation, then, the n-pad 31 and the n-auxiliary electrode 32 are formed in a pattern by removing (i.e., lifting off) the resist mask together with the electrode materials. On the other hand, for the p-electrode 40, an aluminum (Al) film of about 100 Å thickness and a rhodium (Rh) film of about 1,000 Å thickness are formed by electron beam evaporation to form the lower layer 401. Subsequently, a gold (Au) film of about 30 Å thickness is formed to form the upper layer 403. Then, by removing (lifting off) the resist mask together with the electrode materials, the p-pad 41 and the p-auxiliary electrode 42 are formed in a pattern. In order to make the light emission brightness distribution uniform, the n-auxiliary electrode 32 and the p-auxiliary electrode 42 are formed in such shapes that the distance between the two is constant at any place in the chip surface.

In order to achieve good optical reflectivity, the film thickness of the lower layer 401 is preferably 500 Å or greater, more preferably 1,000 Å or greater. In the above-described embodiment, aluminum (Al) is deposited on the p-layer 13, then, rhodium (Rh) is deposited on the aluminum (Al) to form the lower layer 401 in order to make the contact between the p-layer 13 and the p-electrode 40 non-ohmic. When the lower layer 401 is formed to contain titanium (Ti) to improve the adhesion between the p-layer and the p-electrode 40, the film thickness of the Ti layer is preferably 10 Å or less taking the influence on the optical reflectivity into consideration. Further, a middle layer 402 of titanium (Ti) or the like may be formed between the lower layer 401 and the upper layer 403 in order to improve the adhesion between the p-electrode 40 and the light-transmissive electrode 20 and in addition enhance current diffusion in the light-transmissive electrode 20. If the film thickness of the p-electrode is too large, thermal stress or the like due to heat generation when the LED is driven may cause the thin line-shaped p-auxiliary electrode 42 to peel off. Hence, the total film thickness of at least the p-auxiliary electrode is preferably set to be 3,000 Å or less. The film thickness of the p-auxiliary electrode 42 can be adjusted by controlling mainly the film thicknesses of the middle layer 402 and the upper layer 403.

In the above-described embodiment, non-ohmic contact between the p-layer 13 and the p-electrode 40 is achieved through material selection for the p-electrode 40. However, non-ohmic contact between the p-layer 13 and the p-electrode 40 may be obtained by making the p-layer surface be of high resistance by plasma processing with use of an RIE apparatus or the like after forming the resist mask for forming the p-electrode 40. In this case, non-ohmic contact between the p-layer 13 and the p-electrode 40 can be achieved, even if a material other than aluminum (Al) is selected as the electrode material. Further, the non-ohmic contact may be obtained by using a sputtering method in forming the p-electrode 40, which makes the surface of the p-layer 13 be of high resistance by plasma generated in sputtering simultaneously with forming a film of electrode material.

Further, current concentration is likely to occur in the vicinity of the n-pad 31 and the p-pad 41 because the n-pad 31 and the p-pad 41 are larger in area than the n-auxiliary electrode 32 and the p-auxiliary electrode 42. In order to prevent this current concentration, an insulating film of $SiO_2$ or the like may be formed directly under the n-pad 31 and the p-pad 41. Note that the thin line-shaped n-auxiliary electrode 32 and the p-auxiliary electrode 42 are preferably in direct contact with the semiconductor film 14, since the adhesion of metal to oxide is not sufficient.

[Light-Transmissive Electrode Forming Step]

Figure 6D:
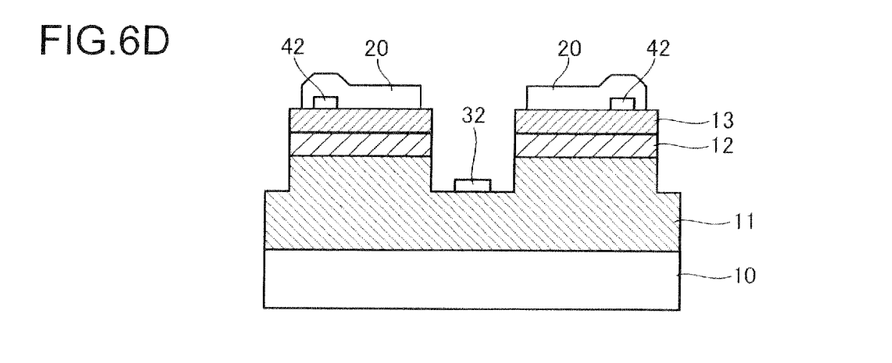

Next, the light-transmissive electrode 20 is formed on the surface of the p-layer 13 (FIG. 6D). Specifically, an indium tin oxide (ITO) film of about 2,600 Å thickness is formed entirely over the substrate by an arc discharge ion plating method. Subsequently, a resist mask is formed over the ITO film, and the substrate is immersed in a commercially-available etchant for ITO kept at 40° C. for 30 to 500 sec. By this means, the ITO film is partially etched to form the opening 21 and make the p-pad 41 exposed through the opening 21. Then, heat treatment is performed in an atmosphere containing oxygen at 600° C. for one minute to oxidize the ITO film so as to improve the light transmittance. By the above process, the light-transmissive electrode 20 is formed on the surface of the p-layer 13. The p-electrode 40 except the opening 21 formed on the p-pad 41 is covered by the light-transmissive electrode 20.

As material for the light-transmissive electrode 20, oxide containing one or more elements selected from, for example, indium (In), tin (Sn), and zinc (Zn) or a thin film of AuNi or the like as well as ITO can be used.

Further, the film thickness of the light-transmissive electrode 20 is preferably greater than that of the p-electrode 40. Lateral current diffusion in the light-transmissive electrode 20 depends on its sheet resistance and contact resistance with the p-layer 13. Because the sheet resistance is inversely proportional to the cross-sectional area perpendicular to the current flow direction, the greater film thickness of the light-transmissive electrode 20 results in the lower sheet resistance, so that current is more likely to be diffused. In order to make the sheet resistance of the light-transmissive electrode 20 as low as possible, the film thickness of the light-transmissive electrode 20 should be set greater than that of the p-auxiliary electrode 42. Meanwhile, taking the light transmittance into consideration, the film thickness of the light-transmissive electrode 20 is preferably set smaller because less light is absorbed. Further, the thickness of the light-transmissive electrode 20 is preferably an integer multiple of the light emission wavelength (i.e., optical wavelength or wavelength in the medium), since loss due to interference is minimal. In the above embodiment, the light-transmissive electrode 20 is formed to have a film thickness of 2,600 Å that, for ITO, meets simultaneously these three requirements of the film thickness of the light-transmissive electrode 20, that is, (1) the film thickness of the light-transmissive electrode 20 being greater than that of the p-auxiliary electrode 42, (2) the film thickness of the light-transmissive electrode 20 being as small as possible, and (3) the film thickness of the light-transmissive electrode 20 being an integer multiple of the optical wavelength of light emission. Methods other than the ion plating method, such as electron beam evaporation or the like, can also be used to form the light-transmissive electrode 20.

[Element Separating Step]

Then, the substrate having undergone the above steps is divided into chips. For the element separation, existing methods such as laser-scribing/breaking, point-scribing/breaking, and dicing can be used.

Having undergone the above steps, the LED chip 1 is fabricated. As such, in the semiconductor light emitting device according to the present invention, the p-electrode is formed directly on the semiconductor film that is more likely to secure adhesion as compared with ITO or the like forming the light-transmissive electrode, and in addition the p-auxiliary electrode and part of the p-pad are covered by the light-transmissive electrode. Hence, the problem of the p-electrode peeling off can be solved, thus improving manufacturing yield and reliability. In particular, the effect of preventing peeling-off by the present invention is noticeable for the p-auxiliary electrode since it is shaped like a thin line and relatively large thermal stress is applied thereto when the LED is driven.

Further, in the semiconductor light emitting device according to the present invention, contact between the semiconductor film and the p-electrode is made to be non-ohmic, thereby relaxing or diminishing current concentration directly under the p-electrode. By this means, the light emission driving current can be diffused across the light-transmissive electrode even with the structure where the p-electrode is formed directly on the semiconductor film, thus causing the light emission brightness distribution to be uniform across the LED chip surface.

Yet further, with the semiconductor light emitting device according to the present invention, the degree of freedom in material selection for the p-electrode has increased since the problem of the p-electrode peeling off is solved as described above. In other words, a material having high optical reflectivity can be selected or used as material for the p-electrode. Therefore, the amount of light absorbed by the p-electrode can be reduced, thus improving the light extraction efficiency. Further, the width of the p-auxiliary electrode can be made smaller than in the conventional art since the problem of the p-electrode peeling-off is solved, and hence areas that are shadows in light emission can be reduced in size, thus further improving the light output.

Second Embodiment

Figure 7A:
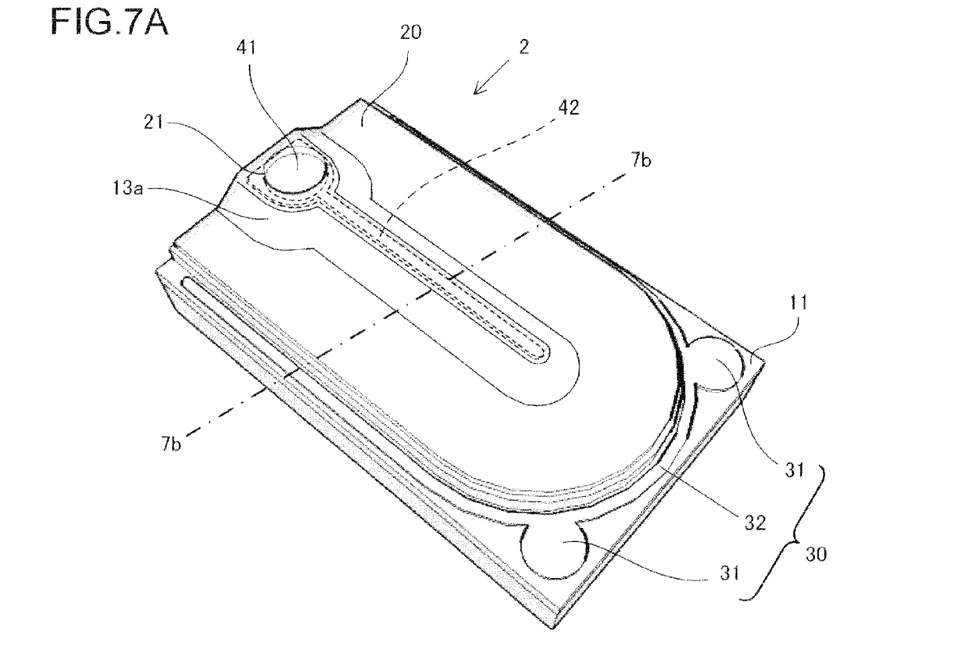
FIG. 7A is a perspective view showing the structure of an LED chip according to a second embodiment of the present invention.
Figure 7B:
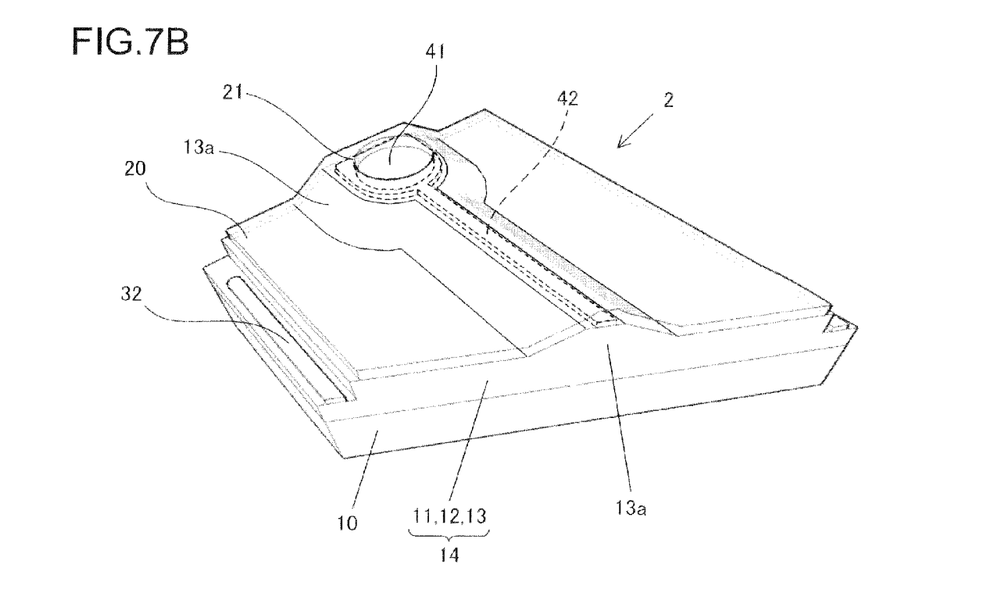
FIG. 7B is a perspective view including a cross-section taken along line 7b-7b of FIG. 7A.
Figure 8:
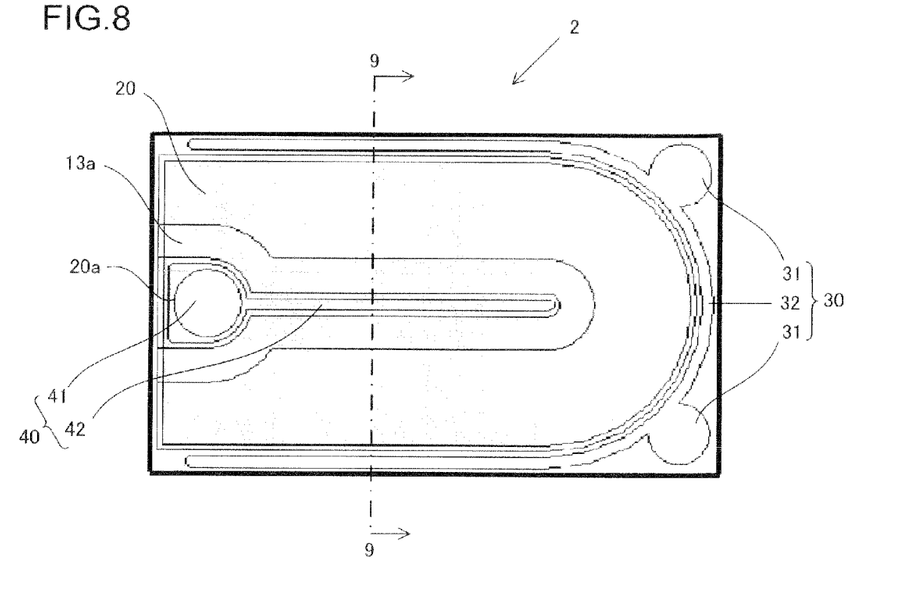
FIG. 8 is a plan view of the LED chip according to the second embodiment of the present invention.
Figure 9:
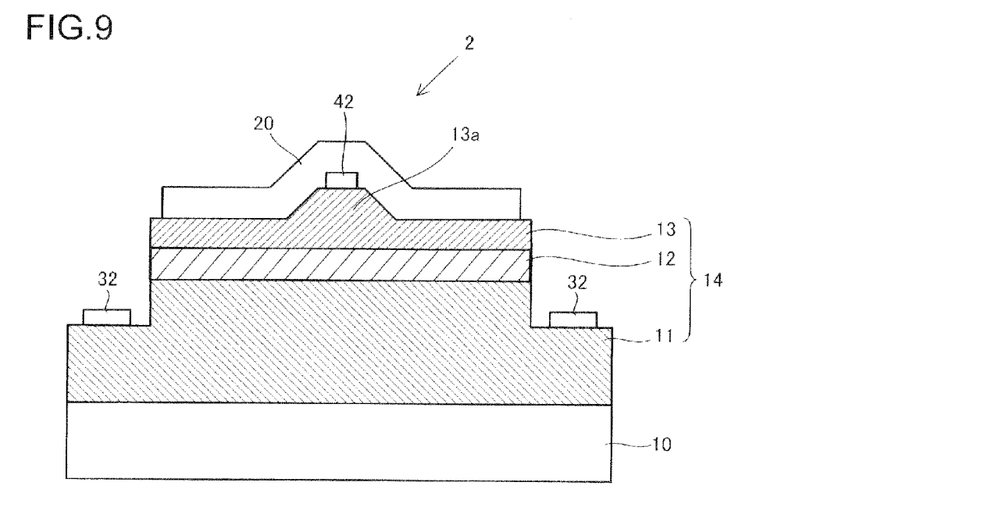
FIG. 9 is a cross-sectional view taken along line 9-9 of FIG. 8.

The semiconductor light emitting device according to a second embodiment of the invention will be described below. FIG. 7A is a perspective view showing the structure of an LED chip 2 according to the second embodiment of the invention; FIG. 7B is a perspective view including a cross-section taken along line 7b-7b of FIG. 7A; FIG. 8A is a plan view; and FIG. 9 is a cross-sectional view taken along line 9-9 of FIG. 8.

A semiconductor film 14 is formed on a growth substrate 10 constituted by a C-plane sapphire substrate or the like, which film is configured with an n-layer 11, a light emitting layer 12, and a p-layer 13, which are made of, e.g., $Al_xIn_yGa_zN$ ($0 \leq x \leq 1$, $0 \leq y \leq 1$, $0 \leq z \leq 1$, $x+y+z=1$) and laid one over another in that order. An n-electrode 30 is formed on the surface of the n-layer 11 exposed by etching down part of the semiconductor film 14. The n-electrode has an n-pad 31 to be wire-bonded and a substantially U-shaped n-auxiliary electrode 32 connected to the n-pad 31.

The p-layer 13 has a protruding portion 13a of trapezoidal cross-section in its extending surface that derives from the crystal structure of $Al_xIn_yGa_zN$ that is a hexagonal crystal. That is, the surfaces of the protruding portion 13a are constituted by crystal planes of $Al_xIn_yGa_zN$. The protruding portion 13a extends along the center line of the LED chip 2 and the upper surface thereof is a flat surface. A p-electrode 40 is provided on the upper surface of the protruding portion 13a. The p-electrode 40 has a p-pad 41 to be wire-bonded and a p-auxiliary electrode 42 connected to the p-pad 41 and extending along the center line of the LED chip 2. The p-pad 41 and the p-auxiliary electrode 42 are both formed on the protruding portion 13a. The p-auxiliary electrode 42, together with the n-auxiliary electrode 32, has the role of relaxing or diminishing current concentration when the LED is driven, thus making the light emission brightness distribution uniform. The n-auxiliary electrode 32 and the p-auxiliary electrode 42 are placed such that the distance between both the electrodes is the same across the surface of the LED chip 2. By this means, the distribution of the light emission driving current flowing between both the electrodes becomes uniform across the surface of the LED chip 2, and thus the light emission brightness distribution can be made uniform.

The surfaces of the p-electrode 40 and the p-layer 13 are covered by a light-transmissive electrode 20 made of, e.g., indium tin oxide (ITO). The light-transmissive electrode 20 is provided with an opening 21. The p-pad 41 is partially exposed through the opening 21, and can be wire-bonded.

As such, the p-pad 41 and the thin line-shaped p-auxiliary electrode 42 are formed directly on the semiconductor film 14 that is more likely to secure adhesion to them as compared with ITO or the like, and in addition are covered by the light-transmissive electrode 20 except the opening 21. Hence, they are unlikely to peel off even when thermal stress is applied thereto.

Note that the p-electrode 40 can be of multilayer structure as in the first embodiment. Further, the contact between the p-electrode 40 and the semiconductor film 14 is preferably non-ohmic contact (Schottky contact). By making the contact between the semiconductor film 14 and the p-electrode 40 be non-ohmic contact, current can be prevented from being concentrated directly under the p-electrode 40, and thus current can be diffused across the light-transmissive electrode 20.

Figure 10:
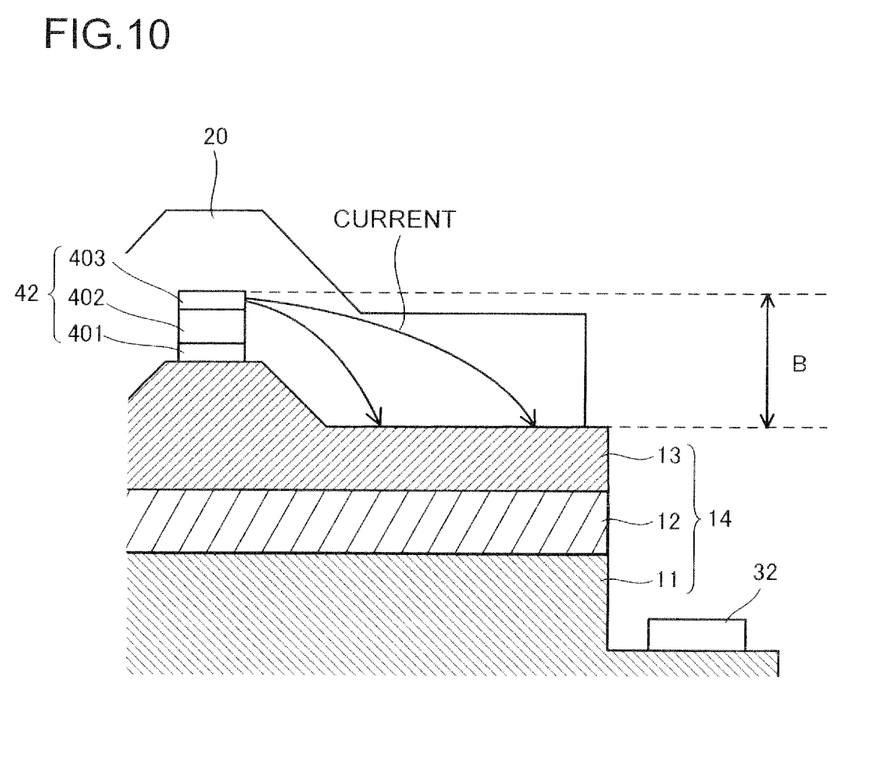
FIG. 10 is an enlarged cross-sectional view of an electrode portion of the LED chip according to the second embodiment of the present invention.

FIG. 10 is an enlarged cross-sectional view of the portion where the p-auxiliary electrode 42 is formed. In the structure of the LED chip 1 according to the first embodiment, the effective sheet resistance associated with the current path in the light-transmissive electrode 20 becomes lower as the thickness of the p-electrode 40 becomes greater, which provides an advantage in making current diffuse in the light-transmissive electrode 20. On the other hand, if the thickness of the p-electrode 40 is too large, peeling-off due to thermal stress or the like is likely to occur. In contrast, in the structure of the LED chip 2 according to the second embodiment, the effective sheet resistance of the light-transmissive electrode 20 can be reduced without an increase in the thickness of the p-electrode 40. More specifically, as obvious from the comparison of FIGS. 5 and 10, the p-electrode 40 which includes the p-pad 40 and the p-auxiliary electrode 42 is provided on the upper surface of the protruding portion 13a of the p-layer 13 in the LED structure of the second embodiment. Therefore, the area of the cross-section through which current flowing out from the upper layer 403 of the p-electrode flows in the light-transmissive electrode 20 is greater than of the first embodiment. In other words, the current path (width "B" in FIG. 10) in a thickness direction of the light-transmissive electrode 20 is wider than in the first embodiment. Hence, the effective sheet resistance of the light-transmissive electrode 20 can be further reduced, enhancing current diffusion in the light-transmissive electrode 20 and contributing to the light emission brightness distribution being uniform across the surface. Further, with this structure, the current diffusion length in the light-transmissive electrode 20 can be extended, and hence the areas of the p-auxiliary electrode 42 and the n-auxiliary electrode 32 can be reduced. Thus, areas that are shadows in light emission can be reduced in size, hence further increasing the light output.

Further, by providing the p-layer 13 with the protruding portion 13a, the light extraction efficiency can be improved as compared with the case where the surface of the p-layer 13 is flat. This is because providing the p-layer 13 with the protruding portion 13a can reduce the amount of light which comes out of the light emitting layer 12 and reflected at the interface between the p-layer 13 and the light-transmissive electrode 20 by total reflection, thus not going outside.

The protruding portion 13a can be formed in the growing step of the p-layer 13, and its shape derives from the crystal structure of $Al_xIn_yGa_zN$ that is a hexagonal crystal. Because the angle formed by the surface of the p-layer 13 and the inclined surface of the protruding portion 13a is constant and about 60 degrees, the width of the upper surface of the protruding portion 13a can be adjusted by its bottom width and height. By setting the height of the protruding portion 13a as large as or larger than the thickness of the light-transmissive electrode 20, the current path can be formed which utilizes the thickness of the light-transmissive electrode 20 to the maximum, enhancing current diffusion in the light-transmissive electrode 20. The thickness of the light-transmissive electrode 20 is preferably about 2,600 Å, and the height of the protruding portion 13a is preferably greater than that. In order to make the protruding portion 13a contribute to improvement in the light extraction efficiency, its height needs to be set sufficiently greater than the light emission wavelength (about 450 nm). Hence, the height of the protruding portion 13a is preferably 5,000 Å or greater. Note that the height of the protruding portion refers to the difference in level between the surface of the p-layer around the protruding portion and the surface of the protruding portion 13a on which the p-electrode 40 is formed.

Figure 11A:
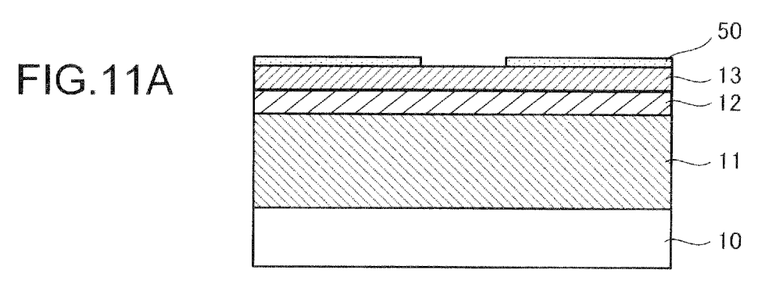
FIGS. 11A to 11C are cross-sectional views showing steps for forming a protruding portion of the LED chip according to the second embodiment of the present invention.
Figure 11B:
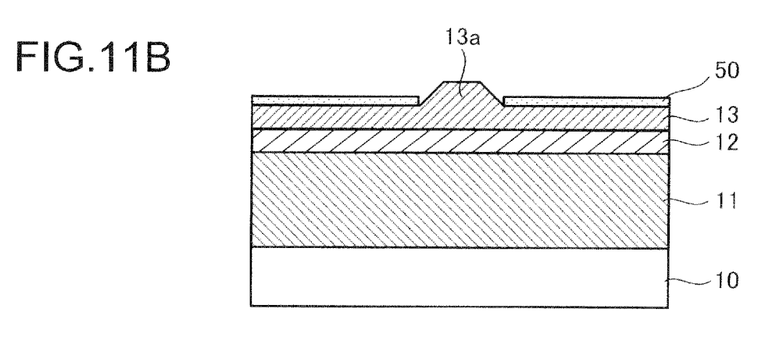

The step for forming the protruding portion 13a (a protruding portion forming step) out of the production process of the LED chip 2 according to the second embodiment will be described with reference to FIGS. 11A to 11C. The semiconductor film forming step, the recess forming step, the electrode forming step, the light-transmissive electrode forming step, and the element separating step except the protruding portion forming step are the same as for the LED chip 1 according to the first embodiment, and hence description thereof is omitted.

After the n-layer 11, the light emitting layer 12, and the p-layer 13 are sequentially formed on the growth substrate 10, a $SiO_2$ film 50 is formed entirely over the surface of the p-layer 13. The $SiO_2$ film 50 is preferably formed by a thermal CVD method, an electron beam evaporation method, or the like, which does not expose the semiconductor film 14 to plasma. Then, a resist mask (not shown) having an opening in its part corresponding to the forming area for the protruding portion 13a, is formed on the $SiO_2$ film 50, and part of the $SiO_2$ film 50 exposed through the opening of the resist mask is etched away using BHF (buffered hydrofluoric acid) to perform patterning of the $SiO_2$ film 50. An opening is formed in the part of the $SiO_2$ film 50 corresponding to the forming area for the protruding portion 13a, and through the opening, the surface of the p-layer 13 is partially exposed (FIG. 11A).

Then, the substrate is put into a MOCVD apparatus, and the semiconductor film is grown with the $SiO_2$ film 50 as a mask. Specifically, under a growth condition for forming the p-layer 13, that is, at an ambient temperature of 870° C., trimethylgallium (TMG) at a flow rate of 8.1 μmol/min, trimethylaluminum (TMA) at a flow rate of 7.5 μmol/min, ammonia ($NH_3$) at a flow rate of 4.4 LM, and CP2Mg (bis-cyclopentadienyl Mg) at a flow rate of $2.9 \times 10^{-7}$ μmol/min are supplied, thereby growing the p-GaN layer. The p-GaN layer is grown on only part of the p-layer 13 exposed through the opening of the $SiO_2$ film 50 and forms the protruding portion 13a. The surfaces of the protruding portion 13a are constituted by crystal planes of $Al_xIn_yGa_zN$, and the shape of a cross-section of the protruding portion 13a is a trapezoid. The height of the protruding portion 13a and the width of its upper surface can be adjusted by growth time (FIG. 11B).

Figure 11C:
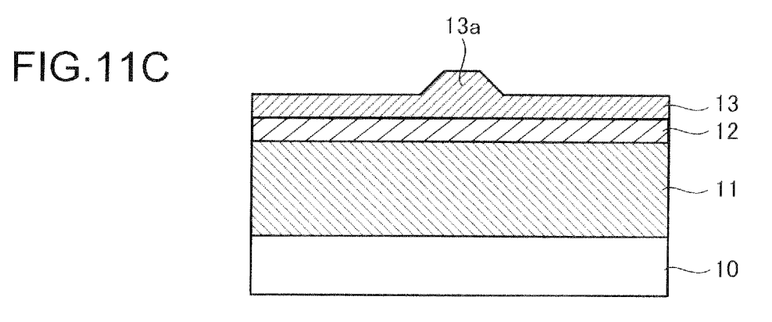

Then, the substrate is immersed in BHF (buffered hydrofluoric acid) to remove the $SiO_2$ film 50 (FIG. 11C). By performing the above steps, the protruding portion 13a is formed on the p-layer 13. Thereafter, as in the first embodiment, the semiconductor film 14 is etched to make the n-layer 11 exposed; the n-electrode 30 and the p-electrode are formed; the light-transmissive electrode 20 is formed to cover the p-electrode 40; the opening 21 is formed; and the resultant substrate is divided into LED chips. Having undergone the above steps, the LED chip 2 according to the second embodiment is fabricated.

Figure 12A:
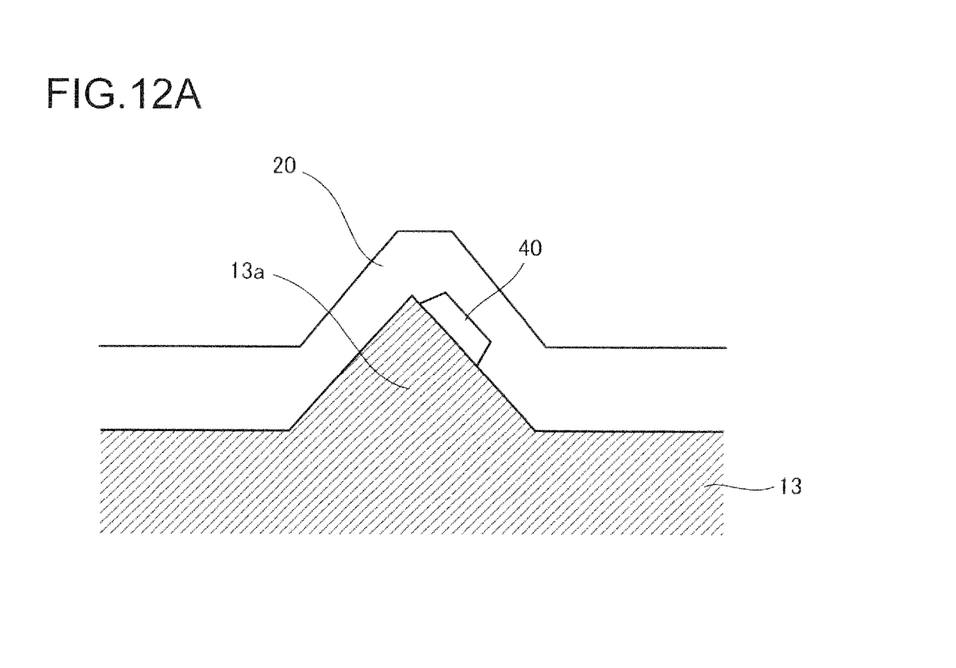
FIGS. 12A and 12B are cross-sectional views showing p-electrodes formed on the protruding portions of the LED chips according to the second embodiment of the present invention.
Figure 12B:
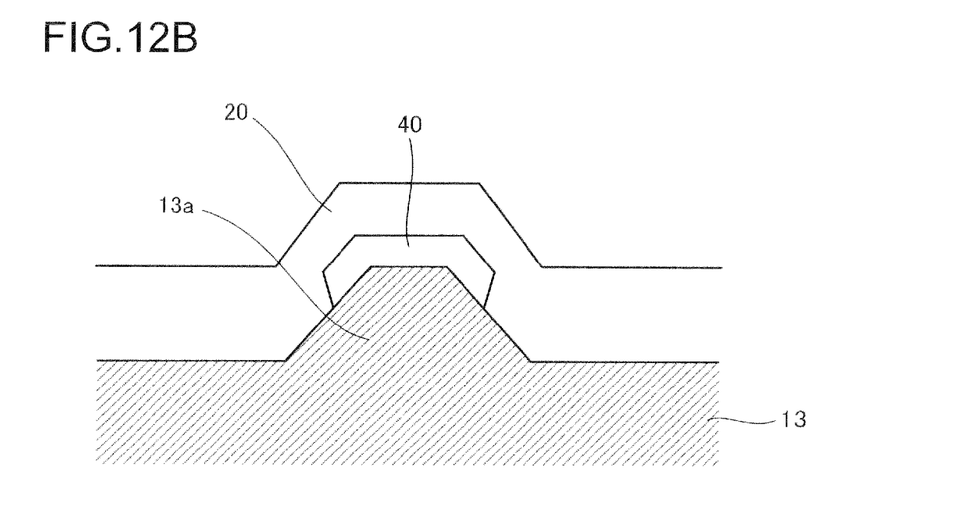

The cross-section shape of the protruding portion 13a may be a triangle as shown in FIG. 12A, not being limited to a trapezoid. In this case, growth time for the p-GaN layer in the protruding portion forming step should be increased. The light output is expected to further increase by making the cross-section shape of the protruding portion 13a be a triangle. Further, in this case, the p-electrode may be formed on a side surface of the protruding portion 13a as shown in FIG. 12A, or formed straddling the top of the protruding portion 13a as shown in FIG. 12B. Yet further, mask material for selective growth need only be a material that can stand crystal growth temperatures and can be patterned. For example, SiN or the like as well as $SiO_2$ can be used.

In the above embodiments, LED chips having the p-layer as their upper surface have been described, but the p-layer and the n-layer may be inverted. That is, the present invention can be applied to the structure having the n-layer as the upper surface and the light-transmissive electrode placed on the n-layer.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2009-211537 which is hereby incorporated by reference.

What is claimed is:

1. A semiconductor light emitting device comprising:
   a first semiconductor layer of a first conductivity type;
   a second semiconductor layer of a second conductivity type different from said first conductivity type;
   a light emitting layer provided between said first semiconductor layer and said second semiconductor layer;
   a first electrode formed on said first semiconductor layer;
   a second electrode formed on said second semiconductor layer; and
   a light-transmissive electrode covering said second semiconductor layer and said second electrode,
   wherein:
      contact between said second electrode and said second semiconductor layer is non-ohmic,
      said second electrode has a stacked structure including a lower layer and an upper layer,
      a contact resistance of said upper layer with said light-transmissive electrode is lower than a contact resistance of said lower layer with said light-transmissive electrode, and
      a part of said second electrode is exposed through an opening formed in said light-transmissive electrode.

2. The semiconductor light emitting device according to claim 1, wherein said second semiconductor layer has a protruding portion in an extending surface thereof, and said second electrode is provided on a surface of said protruding portion.

3. The semiconductor light emitting device according to claim 1, wherein a contact resistance between said second electrode and said second semiconductor layer is higher than a contact resistance between said second electrode and said light-transmissive electrode.

4. The semiconductor light emitting device according to claim 1, wherein said lower layer is made of one material of aluminum, rhodium, and silver, or an alloy of the materials.

5. The semiconductor light emitting device according to claim 1, wherein:
- said first electrode includes a first pad and a line-shaped first auxiliary electrode connected to said first pad; and
- said second electrode includes a second pad and a line-shaped second auxiliary electrode connected to said second pad, and at least part of said second pad is exposed through said opening.

* * * * *